United States Patent
Lin (10) Patent No.: US 10,879,418 B2
(45) Date of Patent: Dec. 29, 2020

(54) LIGHT-SENSING APPARATUS AND ELECTRONIC DEVICE

(71) Applicant: Silergy Semiconductor Technology (Hangzhou) LTD, Hangzhou (CN)

(72) Inventor: Suyi Lin, Hsinchu (TW)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/534,032

(22) Filed: Aug. 7, 2019

(65) Prior Publication Data

US 2020/0058823 A1  Feb. 20, 2020

(30) Foreign Application Priority Data

Aug. 17, 2018  (CN) .......................... 2018 1 0942141

(51) Int. Cl.
| | | |
|---|---|---|
| *H01L 31/167* | (2006.01) | |
| *G01S 7/481* | (2006.01) | |
| *G01S 17/08* | (2006.01) | |
| *H01L 25/16* | (2006.01) | |
| *H01L 31/02* | (2006.01) | |
| *H01L 31/0232* | (2014.01) | |
| *H04B 1/3888* | (2015.01) | |
| *H04M 1/02* | (2006.01) | |
| *H04M 1/725* | (2006.01) | |
| *G06F 1/3231* | (2019.01) | |

(52) U.S. Cl.
CPC .......... *H01L 31/167* (2013.01); *G01S 7/4813* (2013.01); *G01S 17/08* (2013.01); *G06F 1/3231* (2013.01); *H01L 25/165* (2013.01); *H01L 25/167* (2013.01); *H01L 31/02019* (2013.01); *H01L 31/02325* (2013.01); *H04B 1/3888* (2013.01); *H04M 1/0202* (2013.01); *H04M 1/72569* (2013.01); *H04M 2250/12* (2013.01)

(58) Field of Classification Search
CPC ...... G01S 7/4813; G01S 17/08; G06F 1/3231; H01L 25/165; H01L 25/167; H01L 31/02019; H01L 31/02325; H01L 31/167; H04B 1/3888; H04M 1/0202; H04M 1/72569; H04M 2250/12
USPC ..................... 250/338.1; 340/686.6; 356/614
See application file for complete search history.

(56) References Cited

U.S. PATENT DOCUMENTS

| | | | |
|---|---|---|---|
| 9,361,609 B2 | 6/2016 | Franklin et al. | |
| 9,805,630 B2 | 10/2017 | Franklin et al. | |
| 2008/0043491 A1 | 2/2008 | Lin | |
| 2009/0009747 A1* | 1/2009 | Wolf | ........................ G01C 3/08 356/4.01 |
| 2009/0185158 A1* | 7/2009 | Wolf | ....................... G01S 17/08 356/4.01 |

(Continued)

FOREIGN PATENT DOCUMENTS

CN  105302286 A  2/2016

*Primary Examiner* — Colin W Kreutzer
(74) *Attorney, Agent, or Firm* — Michael C. Stephens, Jr.

(57) ABSTRACT

An apparatus disposed below a housing, the apparatus including: a light-sensing element having a light-sensing region, and being configured to sense light reaching the light-sensing region through a first light-transmitting region of the housing; and where when the energy of the light that reaches the light-sensing region is reduced relative to the energy of the light that is expected to reach the light-sensing region, the area of the light-sensing region located under the first light-transmitting region increases.

18 Claims, 7 Drawing Sheets

(56) References Cited

U.S. PATENT DOCUMENTS

| | | |
|---|---|---|
| 2009/0242370 A1 | 10/2009 | Chiang |
| 2010/0258710 A1* | 10/2010 | Wiese ............... H01L 31/02325 |
| | | 250/214.1 |
| 2012/0294579 A1 | 11/2012 | Chen |
| 2014/0055408 A1 | 2/2014 | Liu et al. |
| 2015/0357483 A1* | 12/2015 | Lin ....................... H01L 31/173 |
| | | 250/239 |

* cited by examiner

LIGHT-SENSING APPARATUS AND ELECTRONIC DEVICE

RELATED APPLICATIONS

This application claims the benefit of Chinese Patent Application No. 201810942141.3, filed on Aug. 17, 2018, which is incorporated herein by reference in its entirety.

FIELD OF THE INVENTION

The present invention generally relates to photoelectric sensing technology, and more particularly, to a light-sensing apparatus and an electronic device.

BACKGROUND

In an electronic device having a display system, such as a mobile phone, a proximity sensing device is usually provided to sense the distance of an object from the display screen. Most proximity sensing devices are placed under the outer frame of the edge of the mobile phone. Also, a light-passing hole or a gap may be disposed at a position of the outer frame corresponding to the proximity sensing device. Light emitted from the light-emitting element in the proximity sensing device can be emitted through the light-passing hole or the gap in the outer frame, and reflected by the object close to the display screen. The light reflected by the object can reach the light-sensing region of light-sensing apparatus through the light-passing hole or gap, and may be converted into an electrical signal by the light-sensing element. Then, the distance of the object from the display screen may be obtained according to the electrical signal.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

When the proximity sensing device is placed at a corresponding position under the outer frame, it may deviate from the predetermined position in some cases. In other cases, some impact may occur during use of the electronic device, such that the position of the proximity sensing device is deviated. Then, the positional relationship between the light-emitting element and the light-passing hole or the gap may also deviate from an ideal positional relationship. This may cause the light emitted by the light-emitting element to not all pass through the light-through hole or gap. Then, the energy of the light reflected back by the object may also accordingly decreased. This can reduce the effective sensing value of the light-sensing element, thereby making it difficult to accurately determine the proximity to the object.

In particular embodiments, a light-sensing apparatus includes a light-sensing element, whereby an area of the light-sensing region of the light-sensing element located under the first light-transmission region of the housing may be determined by the deviation between the energy of light actually reaching the light-sensing region and the energy of light that is expected to reach the light-sensing region. That is, the greater the energy of the light that actually reaches the light-sensing region is less than the energy that is expected to reach the light-sensing region, the greater the area of the light-sensing region that is located directly under the first light-transmitting region.

The greater the offset between the positional relationship between the light-emitting element and the second light-transmitting region and the predetermined positional relationship, the more light emitted by the light-emitting element is blocked by the housing, and the energy of the light actually reaching the light-sensing region is much less than the energy of the light that is expected to reach the light-sensing region. In other words, the greater the deviation amount between the positional relationship between the light-emitting element and the second light-transmitting region and the predetermined positional relationship, the more light that is emitted by the light-emitting element is blocked by the housing, and the less energy of the light that actually reaches the light-sensing region.

The energy of the light that is preset/expected to reach the light-sensing region can indicate the light energy that is normally irradiated to the light-sensing region when the incident light is not affected by other factors. For example, when the light emitted by the light-emitting element is not blocked by the housing, the emitted light can be normally irradiated to the light-sensing region (e.g., the energy of the light is not reduced by the blocking), and the energy of the light irradiated to the light-sensing region at this time is the "preset" or "expected" energy.

Figure 1:
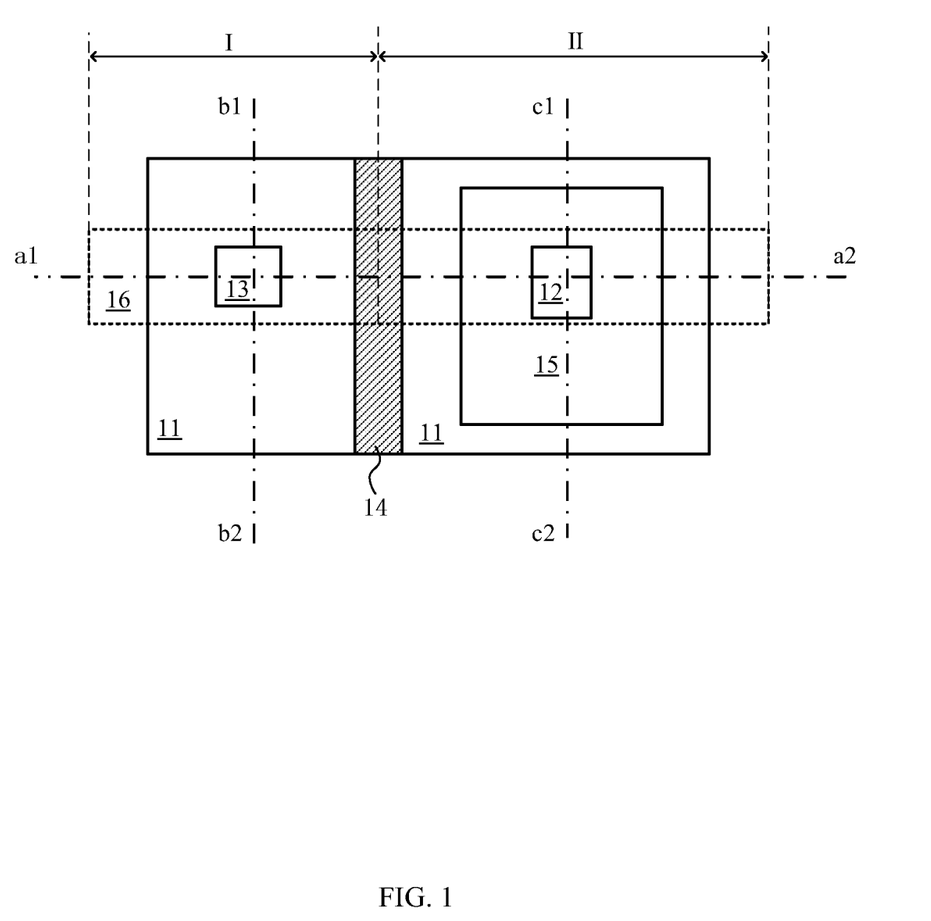
FIG. 1 is a top view diagram of an example light-sensing apparatus.
Figure 2:
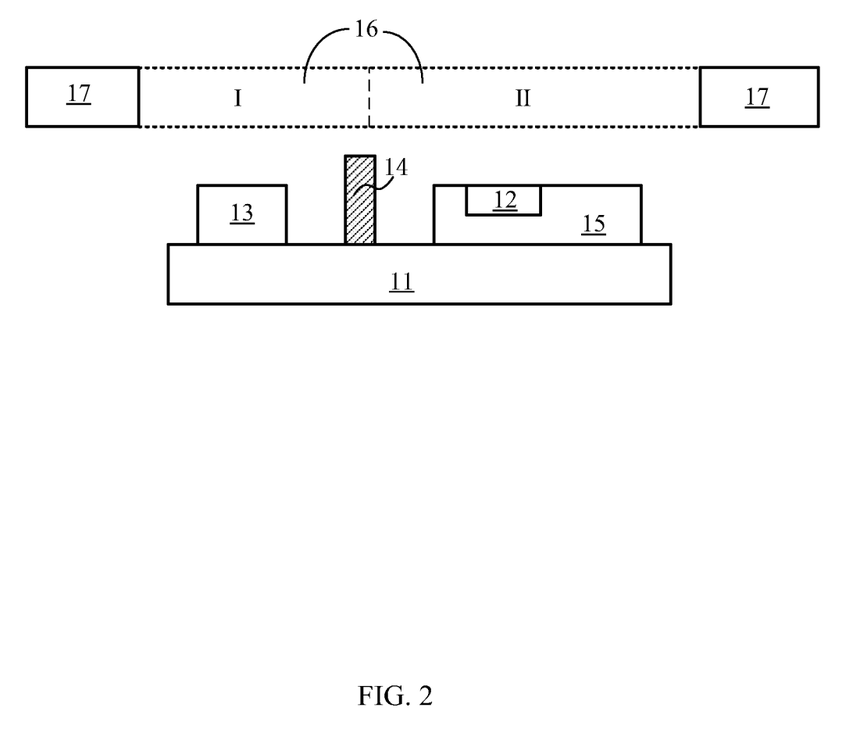
FIG. 2 is a cross-sectional view diagram along the tangential direction of a1a2 in the example of FIG. 1.
Figure 3:
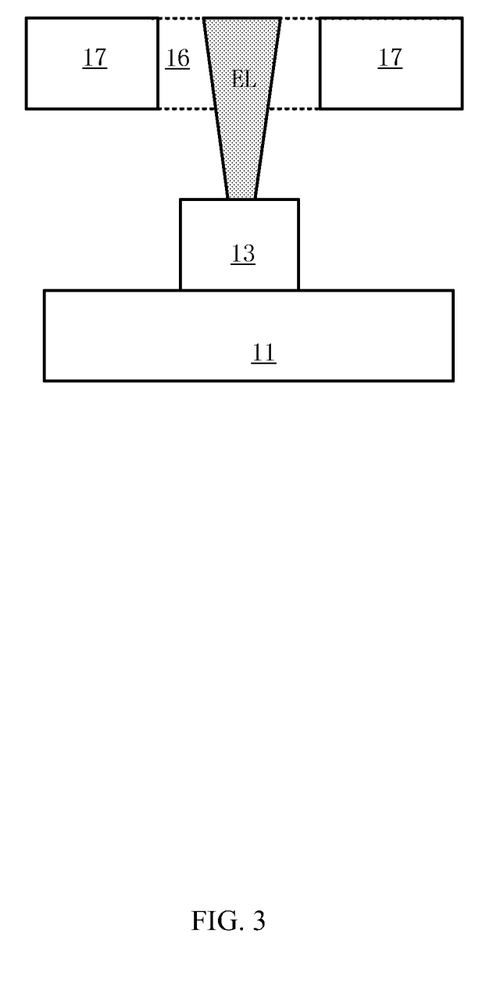
FIG. 3 is a cross-sectional view diagram along the tangential direction of b1b2 in the example of FIG. 1.
Figure 4:
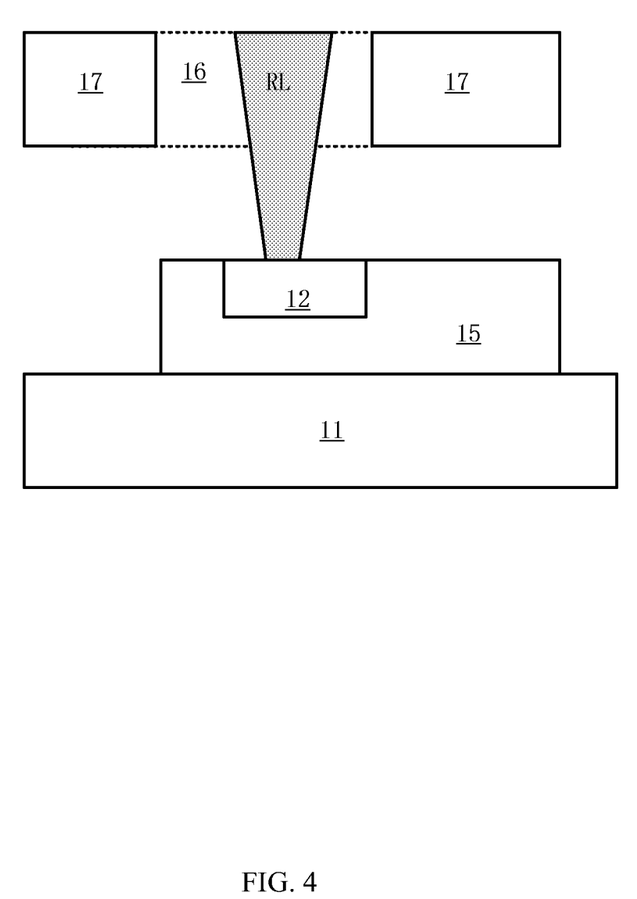
FIG. 4 is a cross-sectional view diagram along the tangential direction of c1c2 in the example of FIG. 1.

Referring now to FIGS. 1-4, in FIG. 1, shown is a top view diagram of an example light-sensing apparatus. In FIG. 2, shown is a cross-sectional view diagram along the tangential direction of a1a2 in the example of FIG. 1. In FIG. 3, shown is a cross-sectional view diagram along the tangential direction of b1b2 in the example of FIG. 1. In FIG. 4, shown is a cross-sectional view diagram along the tangential direction of c1c2 in the example of FIG. 1. The example light-sensing apparatus of FIGS. 1-4 can include circuit substrate 11, light-sensing element 12, light-emitting element 13, light-blocking component 14, and signal processing chip 15. For example, light-emitting element 13 and signal processing chip 15 may both be placed on circuit substrate 11, light-sensing element 12 can be integrated on signal processing chip 15, and light-blocking component 14 may be disposed between light-sensing element 12 and light-emitting element 13.

The light-sensing apparatus can be placed below housing 17, and housing 17 may be provided with aperture 16 having light-transmitting regions I and II (see, e.g., FIG. 2). For example, light EL (see, e.g., FIG. 3) emitted from light-emitting element 13 can be emitted to the outside housing 17 through light-transmitting region I, and then light EL may be reflected by the object approaching housing 17 to form reflected light RL. Reflected light RL may reach the light-sensing region of light-sensing element 12 through light-transmitting region II. Light EL can be sensed by the light-sensing element 12 to convert an optical signal into an electrical signal. Signal processing chip 15 can process the electrical signal to obtain the distance of the object from housing 17.

In order to minimize the size of the frame of the housing, aperture 16 may generally not be very large, and it may be properly set as to the positional relationship between light-emitting element 13 and light-transmitting region I such that light EL emitted from light-emitting element 13 can all pass through light-transmitting region I having as small as possible area. For this reason, it light-emitting element 13 may be located under the middle of light-transmitting region I, and the light-sensing region of light-sensing element 12 can also be located under the middle of light-transmitting region II. For example, aperture 16 may be symmetrical about the connection line of the center of light-emitting element 13 and the center of light-sensing element 12.

Figure 5:
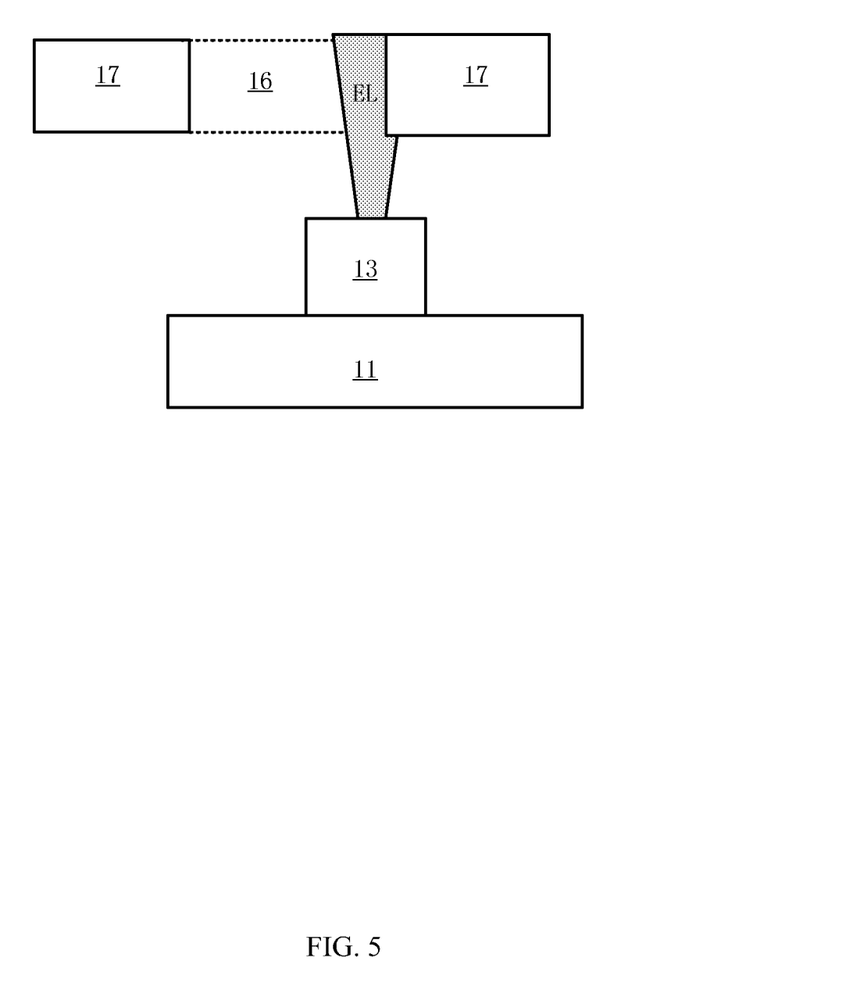
FIG. 5 is a schematic view diagram of example light emitted from the light-emitting element blocked by the housing.

Referring now to FIG. 5, shown is a schematic view diagram of example light emitted from the light-emitting element blocked by the housing. However, the positional relationship between light-emitting element 13 and light-transmitting region I may deviate from the set predetermined positional relationship during the actual placement of the light-sensing apparatus. In this particular example, the portion of light EL emitted by light-emitting element 13 may be blocked by housing 17 such that it cannot entirely pass through light-transmitting region I. In the example light-sensing apparatus shown in FIG. 1, when the positional relationship between light-emitting element 13 and light-transmitting region I deviates from the predetermined positional relationship, the positional relationship between light-sensing element 12 and light-transmitting region II may also deviate.

However, since the width of the light-sensing regions of light-sensing element 12 is constant, when the positional relationship between light-sensing element 12 and light-transmitting region II also deviates, the area of the light-sensing region located under light-transmitting region II may not increase, and may decrease as the positional relationship between light-sensing element 12 and light-transmitting region II deviates. Then, the value of the electrical signal generated by light-sensing element 12 may also decrease, such that the distance of the object and housing 17 obtained by the signal processing chip according to the electric signal may not be the true distance.

In one embodiment, an apparatus can be disposed below a housing, and the apparatus may include: a light-sensing element having a light-sensing region, and being configured to sense light reaching the light-sensing region through a first light-transmitting region of the housing; and where when the energy of the light that reaches the light-sensing region is reduced relative to the energy of the light that is expected to reach the light-sensing region, the area of the light-sensing region located under the first light-transmitting region increases.

Figure 6:
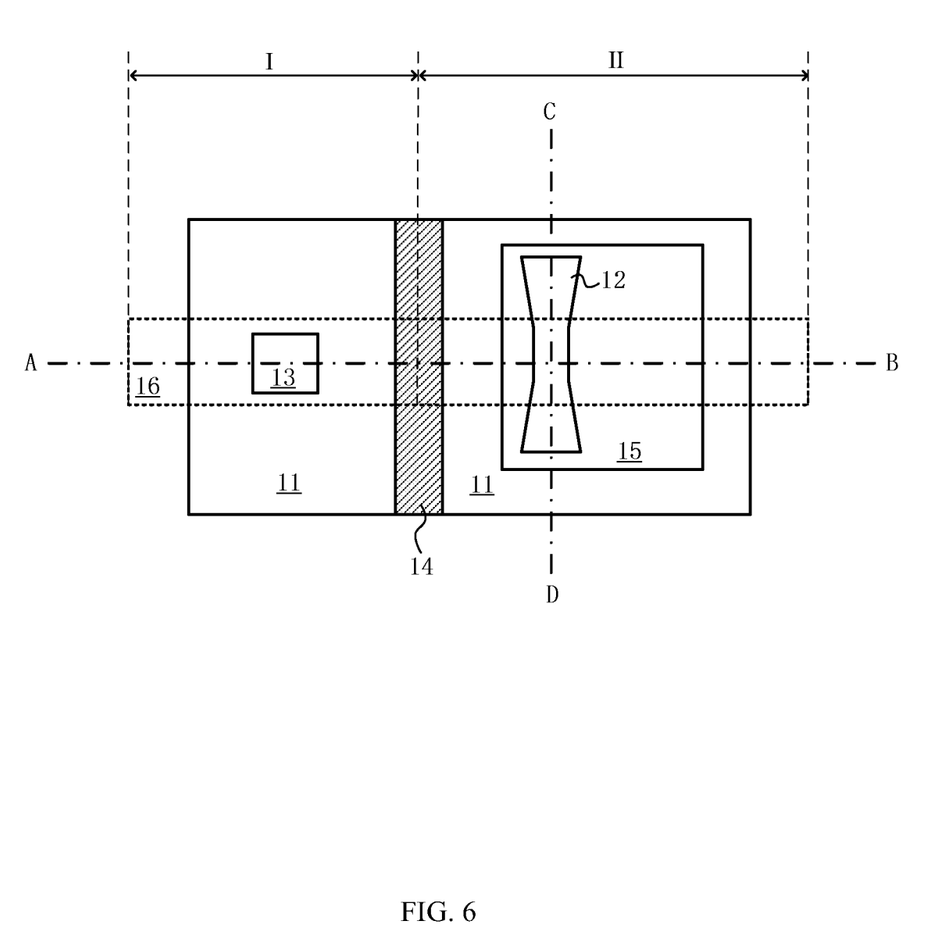
FIG. 6 is a top view diagram of a first example light-sensing apparatus, in accordance with embodiments of the present invention.

Referring now to FIG. 6, shown is a top view diagram of a first example light-sensing apparatus, in accordance with embodiments of the present invention. Referring also to FIG. 2, the first example light-sensing apparatus may be disposed under housing 17. For example, housing 17 can be a display screen of an electronic device (e.g., a mobile phone). The display screen can include a display region and a frame having aperture 16, and the light-sensing apparatus may be placed under aperture 16. Aperture 16 may have the same light-transmitting region I and light-transmitting region II as the aperture 16 in FIG. 1. Light-transmitting region I and light-transmitting region II can be connected to each other. In other examples, light-transmitting region I and light-transmitting region II may not be connected/adjacent. That is, aperture 16 can be replaced by two light-transmitting holes, one of which serves as the light-transmitting region I for emitting light, and the other of which serve as the light-transmitting region II for incident light.

This example light-sensing apparatus can also include light-emitting element 13 and light-sensing element 12 having a light-sensing region. The light emitted from light-emitting element 13 can be emitted to the outside of housing 17 through light-transmitting region I. Thereafter, the light can be reflected by an object approaching the housing, and the reflected light may reach the light-sensing region through light-transmitting region II to be sensed by light-sensing element 12. Thereby, an optical signal can be converted into an electrical signal. In this particular example, the light-sensing region of light-sensing element 12 can be a specially designed light-sensing region. The greater the offset of the positional relationship between light-emitting element 13 and light-transmitting region I with respect to the predetermined positional relationship, the more light emitted by light-emitting element 13 that is blocked by the housing, and the greater the area of the light-sensing region located under light-transmitting region II.

That is, the area of the light-sensing region under the light-transmitting region II may not always be constant, and may correspondingly change according to the amount of the light emitted by light-emitting element 13 that is blocked by housing 17. The more light emitted by light-emitting element 13 that is blocked by the housing 17, the greater the area of light-sensing region located under light-transmitting region II (e.g., capable of receiving portions of incident light through light-transmitting region II). The sensing value of light-sensing element 12 can be compensated such that it may not be much lower than the actual sensing value, thereby substantially avoiding low sensing accuracy due to the light emitted by light-emitting element 13 being blocked by the housing.

In this particular example, when the positional relationship between light-emitting element 13 and light-transmitting region I is a predetermined position relationship (e.g., when the positional relationship between light-emitting element 13 and light-transmitting region I is such that the light emitted from light-emitting element 13 is not blocked by housing 17), the light-sensing region of light-sensing element 12 may not be fully located under light-transmitting region II, and a portion of the light-sensing region may extend beyond the light-transmitting region II.

As shown in FIG. 6, axis CD is parallel to the longitudinal direction of the light-sensing region of light-sensing element 12, and axis AB is parallel to the direction in which light-transmitting region I extends toward light-transmitting region II. For example, the first connection line of a center of light-transmitting region I and the center of light-transmitting region II is parallel to second axis AB. For example, the positional relationship between light-emitting element 13 and light-transmitting region I is the predetermined position relationship. Also, the second connection line of the center of light-emitting element 13 and the center of the light-sensing region of light-sensing element 12 may also be parallel to axis AB. In the axis CD direction, axis AB, the first connection line, and the second connection line can be in the same position. That is, light-transmitting region I and light-transmitting region II may both be symmetric about axis AB. Further, light-emitting element 13 and the light-sensing region of light-sensing element 12 may also be symmetric about axis AB.

When the positional relationship between light-emitting element 13 and light-transmitting region I is the predetermined positional relationship, the angle between axis CD and axis AB is a predetermined angle (e.g., about 90°). When the angle between axis CD and axis AB is less than the predetermined angle, the positional relationship between light-emitting element 13 and light-transmitting region I may deviate from the predetermined positional relationship. Further, the more the angle between axis CD and axis AB is less than the predetermined angle, the greater the offset of the position relationship between light-emitting element 13 and light-transmitting region I and the predetermined positional relationship, and the greater the area of the light-sensing region under light-transmitting region II. For example, the angle between axis CD and axis AB is at least 60° and not more than about 90°

In this particular example, the light-sensing region can include at least one segment of an unequal width region. Also, the width of the unequal width region away from light-transmitting region II may be greater than the width of the unequal width region close to light-transmitting region II in the direction along axis CD. That is, when the positional relationship between light-emitting element 13 and light-transmitting region I is the predetermined positional relationship, in the direction along axis CD, for the portion of the light-sensing region that extends beyond the light-transmitting region II, the width away from axis AB may be greater than the width close to axis AB.

Therefore, when the positional relationship between light-emitting element 13 and light-transmitting region I deviates, the angle between axis CD and axis AB may also deviate. Thus, the wider width light-sensing region that extends beyond the light-transmitting region II may also deviate to under the light-transmitting region II, such that the area of the light-sensing region located under light-transmitting region II is increased to compensate the sensing value of light-sensing element 12. In this example, the light-sensing region can include two segments of the unequal width region and an intermediate region between the two segments of the unequal width regions. When the positional relationship between the light-emitting element and light-transmitting region I is the predetermined positional relationship, the intermediate region may all be located under light-transmitting region II and in a direction along axis CD, whereby the width of the intermediate region is constant.

Further, this example light-sensing apparatus may also include light-blocking component 14, signal processing unit 15, and circuit substrate 11. Light-blocking component 14 may be disposed between light-emitting element 13 and light-sensing element 12. For example, light-emitting element 13 can be a light-emitting diode or a vertical-cavity surface-emitting laser (VCSEL), and light-sensing element 12 may be a photodiode. The light emitted from light-emitting element 13 to the outside of housing 17 can be reflected by the object approaching to the housing, may then pass through light-transmitting region II to reach the light-sensing region, and then be converted into an electrical signal by light-sensing element 12. Signal processing unit 15 can process the electrical signal to obtain a distance of the object from the housing.

In this example, light-sensing element 12 and signal processing unit 15 can be integrated on the same semiconductor substrate, and then placed on circuit substrate 11 together with the light-emitting element 13 to realize the interconnection between the input and output terminals through the circuit substrate. In other examples, light-emitting element 13 and signal processing unit 15 may also be formed on different semiconductor substrates. Further, in order to protect the light-emitting element and the light-sensing element from physical damage, an encapsulant for encapsulating light-emitting element 13 and light-sensing element 12 may also be included in the light-sensing apparatus.

Figure 7:
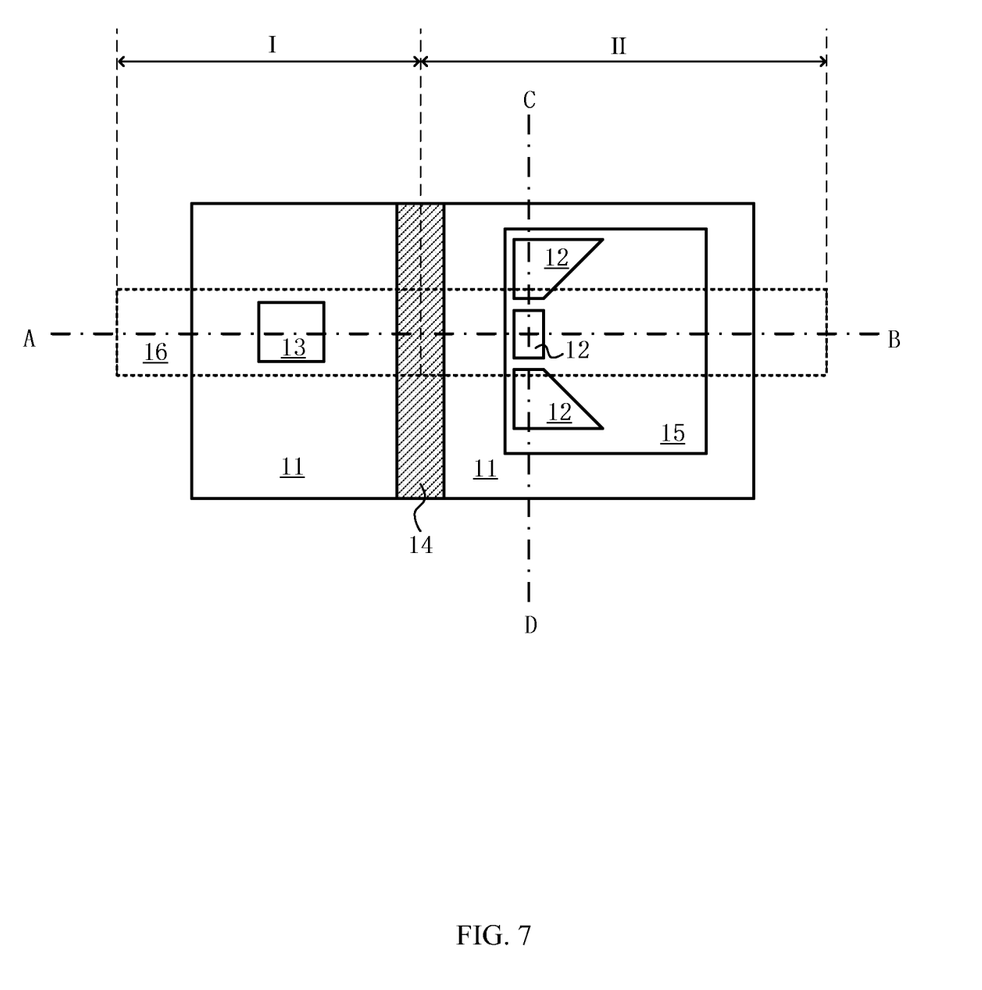
FIG. 7 is a top view diagram of a second example light-sensing apparatus, in accordance with embodiments of the present invention.

Referring now to FIG. 7, shown is a top view diagram of a second example light-sensing apparatus, in accordance with embodiments of the present invention. In this particular example, the light-sensing region has at least one of the unequal width region that is separated from the intermediate region. For example, two segments of the unequal width regions in the light-sensing region can be disposed separately from the intermediate region. When the light emitted by light-emitting element 13 is blocked by housing 17, the area of the light-sensing region located under the light-transmitting region II may rapidly increase, thereby the accuracy of the sensing value of light-sensing element 12 can be improved. In addition, the unequal width regions may be separated from the intermediate region, and the position between the unequal width region and the intermediate region can also be used to dispose other elements, which can save overall chip area.

Also in particular embodiments, an electronic device can include any of the light-sensing apparatuses provided herein and the housing, where the light-sensing apparatus can be located below the housing. The housing may be a display screen of the electronic device, and the light-sensing apparatus can be located below a display region of the display screen.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. An apparatus disposed below a housing, the apparatus comprising:
    a) a light-sensing element having a light-sensing region, and being configured to sense light reaching the light-sensing region through a first light-transmitting region of the housing, wherein light emitted by a light-emitting element is emitted to outside the housing through a second light-transmitting region of the housing, a length direction of the light-sensing region is parallel to a first axis, and a direction in which the first light-transmitting region extends toward the second light-transmitting region is parallel to a second axis;
b) wherein the greater the offset between a positional relationship of the light-emitting element and the second light-transmitting region and its predetermined positional relationship, the more light emitted by the light-emitting element is blocked by the housing, and the energy of the light that reaches the light-sensing region is less than the energy of the light that is expected to reach the light-sensing region; and
c) wherein the light-sensing region comprises at least one unequal width region, and in a direction along the first axis, a width of the unequal width region away from the first light-transmitting region is greater than a width of the unequal width region closer to the first light-transmission region.

2. The apparatus of claim 1, wherein when light emitted by the light-emitting element is not blocked by the housing, a positional relationship between the light-emitting element and the second light-transmitting region is the predetermined positional relationship.

3. The apparatus of claim 1, wherein when the positional relationship between the light-emitting element and the second light-transmitting region is the predetermined positional relationship, an angle between the first axis and the second axis is a predetermined angle.

4. The apparatus of claim 3, wherein the predetermined angle is 90°.

5. The apparatus of claim 3, wherein:
a) when the angle between the first axis and the second axis is less than the predetermined angle, the positional relationship between the light-emitting element and the second light-transmitting region deviates from the predetermined positional relationship;
b) the more the angle between the first axis and the second axis is less than the predetermined angle, the greater the offset between the position relationship of the light-emitting element and the second light-transmitting region and the predetermined position relationship; and
c) the angle between the first axis and the second axis is at least 60° and not more than 90°.

6. The apparatus of claim 1, wherein the light-sensing region comprises two unequal width regions and an intermediate region between the two unequal width regions.

7. The apparatus of claim 6, wherein when the positional relationship between the light-emitting element and the second light-transmitting region is the predetermined positional relationship, the intermediate region is fully located under the first light-transmitting region.

8. The apparatus of claim 6, wherein at least one unequal width regions is disposed separately from the intermediate region.

9. The apparatus of claim 6, wherein in the direction along the first axis, the width of the intermediate region is constant.

10. The apparatus of claim 1, wherein the light-sensing region is symmetrical about the second axis when the positional relationship between the light-emitting element and the second light-transmitting region is the predetermined positional relationship.

11. The apparatus of claim 1, wherein when the positional relationship between the light-emitting element and the second light-transmitting region is the predetermined positional relationship, a connection line of the center of the light-emitting element and the center of the light-sensing region coincides with the second axis.

12. The apparatus of claim 1, wherein when the positional relationship between the light-emitting element and the second light-transmitting region is the predetermined positional relationship, the first light-transmitting region and the second light-transmitting region are both symmetric about the second axis.

13. The apparatus of claim 1, further comprising a light-blocking component disposed between the light-emitting element and the light-sensing element.

14. The apparatus of claim 1, further comprising:
a) a signal processing unit configured to process an electrical signal to obtain a distance of an object from the housing; and
b) wherein the light emitted from the light-emitting element to outside the housing is reflected by the object, then passes through the first light-transmitting region to reach the light-sensing region, and then is converted the electrical signal by the light-sensing element.

15. The apparatus of claim 14, wherein the light-sensing element is integrated with the signal processing unit on the same semiconductor substrate.

16. The apparatus of claim 1, further comprising an encapsulant that encapsulates the light-sensing element.

17. An electronic device, comprising the apparatus and the housing of claim 1, and being configured as a mobile phone.

18. The electronic device of claim 17, wherein the housing comprises a display screen, and the apparatus is located below a display region of the display screen.

* * * * *